US012590366B2

(12) United States Patent
Kim et al.

(10) Patent No.: US 12,590,366 B2
(45) Date of Patent: Mar. 31, 2026

(54) CANISTER, PRECURSOR TRANSFER SYSTEM HAVING THE SAME AND METHOD FOR MEASURING PRECURSOR REMAINING AMOUNT THEREOF

(71) Applicant: SAMSUNG ELECTRONICS CO., LTD., Suwon-si (KR)

(72) Inventors: Kyungrim Kim, Suwon-si (KR); Dowon Kim, Suwon-si (KR); Sunja Kim, Suwon-si (KR); Youngeun Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 441 days.

(21) Appl. No.: 18/133,909

(22) Filed: Apr. 12, 2023

(65) Prior Publication Data

US 2024/0124972 A1 Apr. 18, 2024

(30) Foreign Application Priority Data

Oct. 6, 2022 (KR) ........................ 10-2022-0128036

(51) Int. Cl.
*C23C 16/448* (2006.01)
*C23C 16/455* (2006.01)
*C23C 16/52* (2006.01)

(52) U.S. Cl.
CPC .... *C23C 16/4481* (2013.01); *C23C 16/45527* (2013.01); *C23C 16/45544* (2013.01); *C23C 16/45553* (2013.01); *C23C 16/52* (2013.01)

(58) Field of Classification Search
None
See application file for complete search history.

(56) References Cited

U.S. PATENT DOCUMENTS

| | | | |
|---|---|---|---|
| 4,280,126 A * | 7/1981 | White | G01F 23/2965 |
| | | | 340/621 |
| 5,377,429 A | 1/1995 | Sandhu et al. | |
| 6,839,505 B2 | 1/2005 | Sandhu | |
| 10,571,430 B2 | 2/2020 | Cheng et al. | |
| 2004/0015300 A1 | 1/2004 | Ganguli et al. | |
| 2008/0044573 A1 | 2/2008 | Chen et al. | |
| 2010/0255198 A1 | 10/2010 | Cleary et al. | |

FOREIGN PATENT DOCUMENTS

| | | | |
|---|---|---|---|
| JP | H04369833 A | * | 12/1992 |
| KR | 20050037651 A | * | 4/2005 |
| KR | 10-0592977 B1 | | 6/2006 |
| KR | 10-0778384 B1 | | 11/2007 |
| KR | 10-2022-0122918 A | | 9/2022 |

* cited by examiner

*Primary Examiner* — Alexander M Weddle
(74) *Attorney, Agent, or Firm* — Sughrue Mion, PLLC

(57) ABSTRACT

A canister supplying a precursor to a processing chamber includes a body, a first valve introducing a carrier gas into the body, a second valve discharging a sublimated gas of a solid precursor into a processing chamber, a precursor accommodating tray accommodating the solid precursor, and at least one piezoelectric transducer at least one of vibrating the precursor accommodating tray or measuring a resonance frequency.

20 Claims, 7 Drawing Sheets

CANISTER, PRECURSOR TRANSFER SYSTEM HAVING THE SAME AND METHOD FOR MEASURING PRECURSOR REMAINING AMOUNT THEREOF

CROSS-REFERENCE TO RELATED APPLICATION(S)

This application claims priority to Korean Patent Application No. 10-2022-0128036, filed on Oct. 6, 2022, in the Korean Intellectual Property Office, the disclosure of which is incorporated by reference herein in its entirety.

BACKGROUND

The disclosure relates to a canister, a precursor transfer system having the same, and a method for measuring the remaining amount of a precursor therefor.

In general, various raw materials (sources) used in processing facilities, such as chemical vapor deposition (CVD) or atomic layer deposition (ALD) that form essential thin films in a manufacturing process of electronic materials, such as semiconductor memories, displays, and light emitting diodes are supplied in the form of gases, liquids, or solids. Raw materials in the form of a gas may have their pressure adjusted and may be supplied in certain amounts or quantities. Since raw materials in the form of a liquid or a solid have a very low pressure, they may be inserted into an ampoule called a canister, vaporized through bubbling using a carrier gas or steam generation through heating, and then supplied to a reaction chamber.

SUMMARY

An aspect of an example embodiment provides a canister capable of monitoring a remaining amount of a precursor, a precursor transfer system having the same, and a method for measuring a remaining amount of a precursor thereof.

According to an aspect of an example embodiment, a canister supplying a precursor to a processing chamber includes: a body; a first valve configured to introduce a carrier gas into the body; a second valve configured to discharge a sublimated gas comprising a solid precursor into a processing chamber; a precursor accommodating tray configured to accommodate the solid precursor; and at least one piezoelectric transducer configured to at least one of vibrate the precursor accommodating tray or measure a resonance frequency.

According to an aspect of an example embodiment, a precursor transfer system includes: a carrier gas supply device configured to discharge a carrier gas; a canister configured to receive the carrier gas through a first pipe and to discharge a mixed gas comprising a sublimated gas of a solid precursor through a second pipe; a reaction gas supply device configured to discharge at least one reaction gas through a third pipe; and a processing chamber configured to provide the mixed gas and the at least one reaction gas to a substrate on a chuck, wherein the canister comprises a piezoelectric transducer configured to at least one of vibrate a precursor accommodating tray accommodating the solid precursor or to measure a resonance frequency.

According to an aspect of an example embodiment, an operating method of a canister accommodating a solid precursor includes: detecting a resonance frequency of the canister using a piezoelectric transducer; and calculating a remaining amount of the solid precursor based at least in part on the detected resonance frequency.

BRIEF DESCRIPTION OF DRAWINGS

The above and other aspects and features will be more apparent from the following description of example embodiments, taken in conjunction with the accompanying drawings, in which.

DETAILED DESCRIPTION

Example embodiments will be described more fully with reference to the accompanying drawings, in which example embodiments are shown. Embodiments described herein are provided as examples, and thus, the present disclosure is not limited thereto, and may be realized in various other forms. Each embodiment provided in the following description is not excluded from being associated with one or more features of another example or another embodiment also provided herein or not provided herein but consistent with the present disclosure. It will be understood that when an element or layer is referred to as being "on," "connected to" or "coupled to" another element or layer, it can be directly on, connected or coupled to the other element or layer, or intervening elements or layers may be present. By contrast, when an element is referred to as being "directly on," "directly connected to" or "directly coupled to" another element or layer, there are no intervening elements or layers present. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

A canister, a precursor transfer system having the same, and an operating method thereof according to an embodiment may measure a remaining amount of a solid precursor using a piezoelectric transducer or discharge vapor trapped between particles by vibrating the solid precursor. Therefore, the canister, the precursor transfer system having the same, and the operating method thereof of an embodiment may effectively measure the remaining amount of the precursor and stably supply the precursor.

Figure 1:
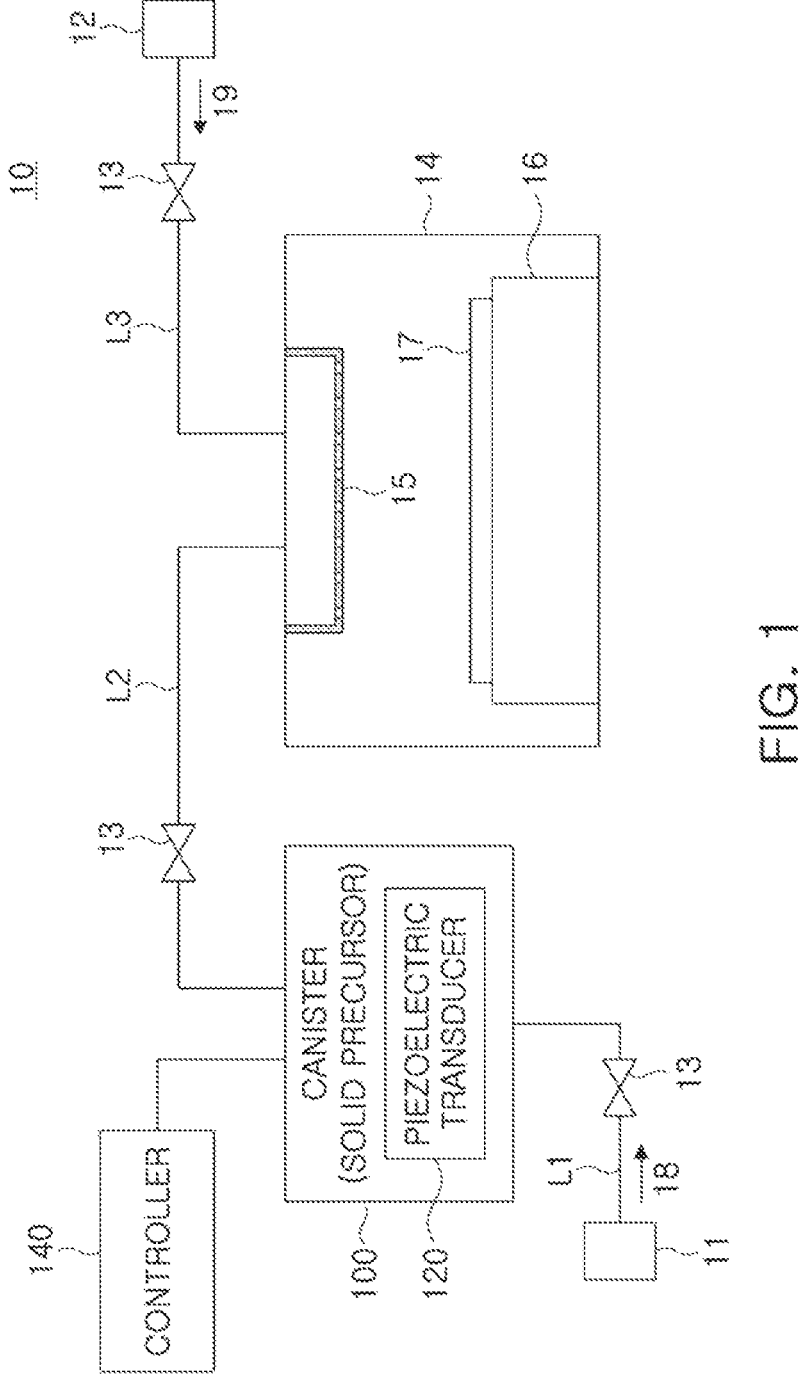
FIG. 1 is a diagram illustrating a precursor transfer system according to an embodiment.

FIG. 1 is a diagram illustrating a precursor transfer system 10 according to an embodiment. Referring to FIG. 1, the precursor transfer system 10 may include a carrier gas supply device 11, a reaction gas supply device 12, a gate valve 13, a processing chamber 14, first supply line L1, second supply line L2, third supply line L3, and a canister 100.

The carrier gas supply device 11 may supply a carrier gas 18 to the canister 100. The carrier gas 18 may include an inert gas, such as nitrogen (N2), argon (Ar), or helium (He). The carrier gas 18 may have a high temperature within a range in which a solid precursor is not thermally decomposed. The heated carrier gas 18 may sublimate the solid precursor to a gaseous state.

The reaction gas supply device 12 may provide a reaction gas 19 to the processing chamber 14. The reaction gas 19 may include, for example, ammonia ($NH_3$), water ($H_2O$), ozone ($O_3$), and the like.

The processing chamber 14 may include a chemical vapor deposition (CVD) device or an atomic layer deposition (ALD) device. The processing chamber 14 may include a showerhead assembly 15, a susceptor 16, and a substrate 17. The showerhead assembly 15 may be disposed at an upper portion of the processing chamber 14. The showerhead assembly 15 may include one or a plurality of showerheads. The showerhead assembly 15 may uniformly provide one or both of the carrier gas 18 and the reaction gas 19 supplied to the processing chamber 14 onto the substrate 17. The susceptor 16 may be disposed at a lower portion of the processing chamber 14, and the substrate 17 may be formed on the susceptor 16. The processing chamber 14 may include a sealing member and may form a sealed space.

A mixed gas or reaction gas 19 may be supplied to the processing chamber 14. The carrier gas 18 and/or the reaction gas 19 supplied to the processing chamber 14 may be provided onto the substrate 17. A purge gas may be supplied to the processing chamber 14 through a purge gas supply device. The purge gas may include an inert gas, such as, for example, nitrogen ($N_2$), argon (Ar), or helium (He). The carrier gas 18, the purge gas, and the reaction gas 19 may be supplied to the processing chamber 14 one by one in each unit cycle at regular intervals. For example, in an embodiment, gases may be alternately supplied to the processing chamber 14 in the order of the carrier gas 18, the purge gas, the reaction gas 19, and the purge gas at specific time intervals. In an embodiment, only one type of gas may be supplied at a time, more than one type of gas may be supplied at the same time or a combination thereof.

The first supply line L1 may connect the carrier gas supply device 11 to the canister 100. The carrier gas 18 may be supplied to the canister 100 through the first supply line L1. The second supply line L2 may connect the canister 100 to the processing chamber 14. The carrier gas 18 including the gaseous precursor may be supplied to the processing chamber 14 through the second supply line L2. The third supply line L3 may connect the reaction gas supply device 12 to the processing chamber 14. The reaction gas 19 may be supplied to the processing chamber 14 through the third supply line L3, a path different from that of the carrier gas 18. The gate valve 13 may adjust a flow rate of the gases flowing through the first supply line L1, the second supply line L2, and the third supply line L3.

The canister 100 may be configured to receive the carrier gas 18, sublimate a solid precursor to generate a gaseous precursor, and provide a mixed gas including the gaseous precursor to the processing chamber 14. In an embodiment, the solid precursor may be disposed in a precursor accommodating space of the canister 100. The solid precursor may include a hollow inside to allow the carrier gas 18 to pass therethrough. The solid precursor may be formed in the precursor accommodating space in a ring shape by a method such as compression. In an embodiment, the solid precursor may be a precursor including tantalum, lanthanum, tungsten (W), molybdenum (Mo), and cobalt (Co) and may include $Ta[(N(CH_3)_2]_5(PDMAT)$, $TaCl_5$, $TaF_5$, $TaBr_5$, $TaI_5$, $Ta(CO)_5$, $W(CO)_6$, $Mo(CO)_6$, $MoF_5$, $Co_2(CO)_8$, $MoO_2Cl_2$, or $MoCl_5$.

In addition, the canister 100 may include a piezoelectric transducer 120 and a controller 140.

The piezoelectric transducer 120 may be configured to vibrate an internal vessel of the canister 100 and/or to measure a resonance frequency. The piezoelectric transducer 120 may convert electrical energy into vibration energy and/or convert vibration energy into electrical energy.

The controller 140 may be configured to control the piezoelectric transducer 120 of the canister 100. The controller 140 may control the piezoelectric transducer 120 to measure a resonance frequency of the internal vessel of the canister 100 in order to measure a remaining amount of a precursor. The controller 140 may detect a change in mass of the precursor using the measured resonance frequency. In addition, the controller 140 may control the piezoelectric transducer 120 to vibrate powder particles of the precursor inside the canister 100 to release vapor trapped between the precursor particles.

In general, as the scale of memory transistors has been gradually miniaturized, the introduction of new materials having resistivity lower than existing materials is required. For this reason, a deposition method using a $MoO_2Cl_2$ or $MoCl_5$ precursor having low resistivity even in a thin thickness may have been used. The $MoO_2Cl_2$ or $MoCl_5$ precursors may exist in a solid state at room temperature due to low vapor pressure characteristics thereof. In order to effectively store/supply precursors in a deposition facility, canisters dedicated to solid precursors may have been used. In general, knowing the exact replacement time of the solid precursor is important in terms of facility unit per equipment hour (UPEH) and a wafer production capacity per space and cost (WPPS). However, it may be difficult for general canisters to accurately measure the remaining amount of the solid precursor, and thus it may be difficult to predict a replacement time. In addition, the general canisters may not stably supply sublimated vapor compared to a liquid precursor to the chamber, and may have an unstable supply pressure problem.

The precursor transfer system 10 according to an embodiment may include a canister 100 that may alleviate one or more of the problems of solid precursors described above. In the canister 100 of an embodiment, by applying the piezoelectric transducer 120 technology to a structure for sublimating a solid precursor, a remaining amount of the precursor may be effectively measured, and gases sublimated in the canister 100 may be smoothly supplied to the processing chamber 14. That is, in the canister 100 of an embodiment, a remaining mass may be measured by measuring a resonance frequency of the precursor using the piezoelectric transducer 120. In addition, in the canister 100 of an embodiment, vapor trapped between the particles may be released by vibrating the precursor powder particles through the piezoelectric transducer 120.

5

Figure 2:
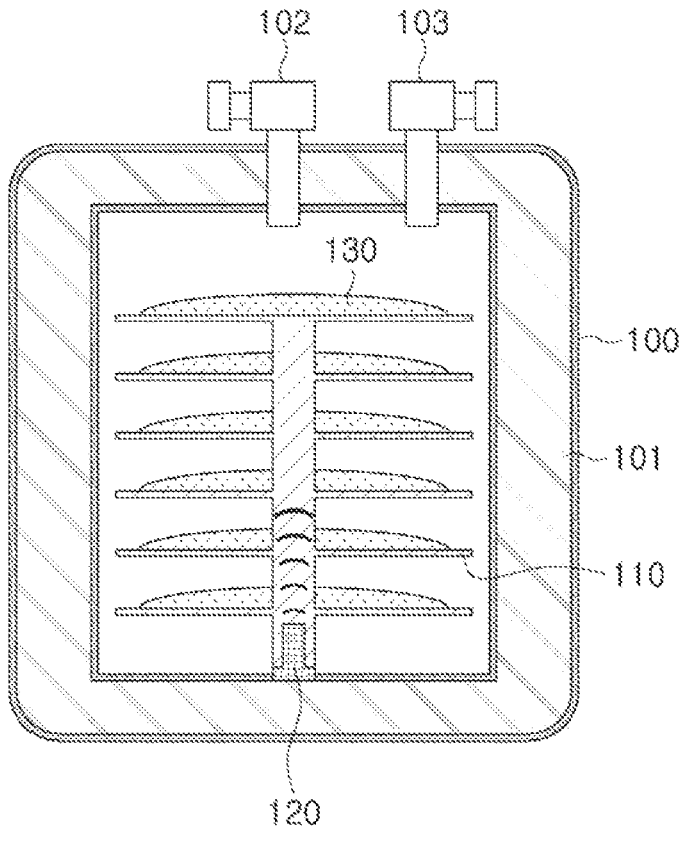
FIG. 2 is a view illustrating a canister according to an embodiment.

FIG. 2 is a view illustrating the canister 100 according to an embodiment. Referring to FIG. 2, the canister 100 may include a body 101, a first valve 102, a second valve 103, a precursor accommodating tray 110, and the piezoelectric transducer 120.

The body 101 may have a cylindrical shape. However, the shape of the body 101 in embodiments is not be limited thereto and the shape of the body 101 may be different in various embodiments. For example, the body 101 may have a box shape.

The body 101 may include a heating unit. The heating unit may be disposed on an outer circumferential surface of the body 101. The heating unit may heat the body 101 of the canister, thereby heating the solid precursor in the precursor accommodating space. The heating unit may heat the body 101 within a range in which the solid precursor is not thermally decomposed and a temperature required for sublimation is maintained. In an embodiment, the heating unit may be located inside the canister 100. The heating unit may be controlled by a temperature controller.

The first valve 102 may be configured to allow a carrier gas to be introduced into the canister 100. The second valve 103 may be configured to allow a vaporized precursor gas to be discharged to the outside of the canister 100.

The precursor accommodating tray 110 may be configured to accommodate the solid precursor 130 in a powder form. In an embodiment, the precursor accommodating tray 110 may be separable such that it can be separated from the canister 100 when the solid precursor is replaced or the canister 100 is cleaned. In an embodiment, the precursor accommodating tray 110 may be integrally formed inside the precursor accommodating space. In another embodiment, the precursor accommodating tray 110 may be configured to allow a plurality of support vessels to be stacked thereon. The plurality of support vessels being stacked may be parallel to an axial direction of the canister 100.

The piezoelectric transducer 120 may be configured to measure a resonance frequency of the canister 100 or to vibrate the precursor accommodating tray 110. The piezoelectric transducer 120 may be disposed inside the precursor accommodating tray 110 as illustrated in FIG. 2, but a location and arrangement of the piezoelectric transducer 120 of embodiments is not limited thereto.

In an embodiment, the piezoelectric transducer 120 may measure the resonance frequency of the precursor. A change in mass of the precursor may be calculated using the measured resonance frequency.

In an embodiment, the piezoelectric transducer 120 may generate vibrations in precursor powder particles. Vapor trapped between the precursor powder particles may be released by the generated vibration. Accordingly, a sublimation process in which the precursor transitions from the solid state to a gaseous state may be improved.

Figure 3A:
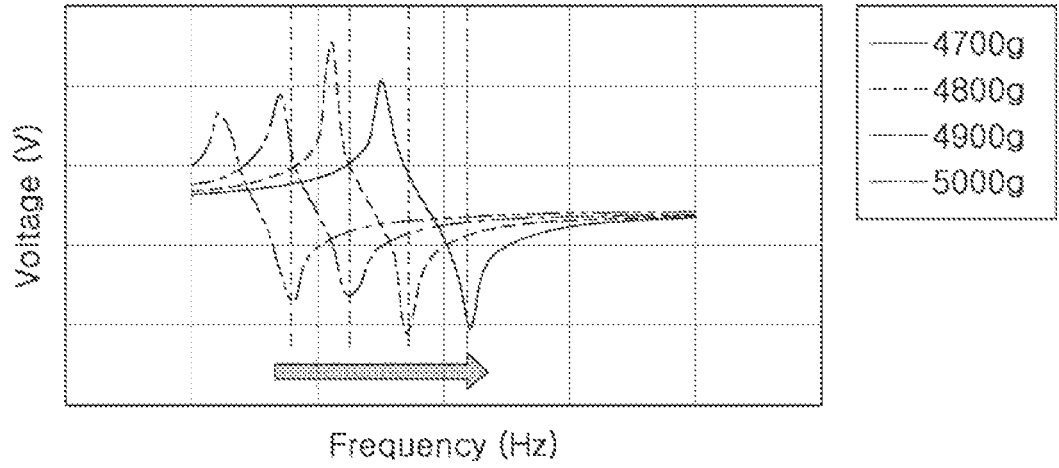
FIG. 3A is a diagram illustrating an output voltage of a piezoelectric transducer according to a remaining amount of a precursor.
Figure 3B:
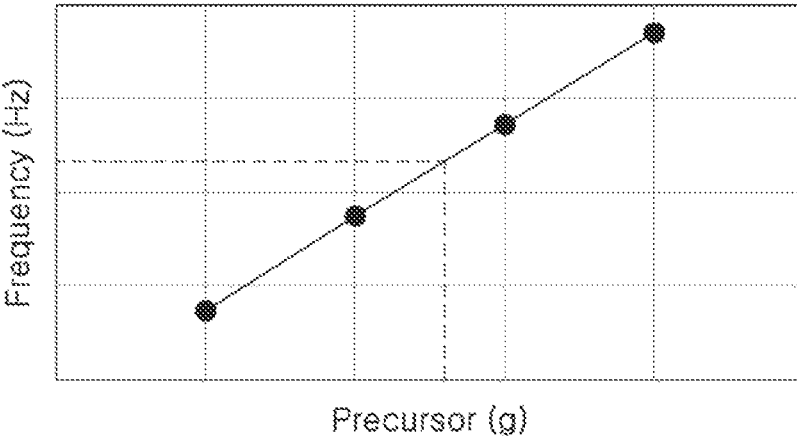
FIG. 3B is a diagram illustrating a resonance frequency according to the remaining amount of the precursor.

FIG. 3A is a diagram illustrating an output voltage of the piezoelectric transducer 120 according to a remaining amount of a precursor, and FIG. 3B is a diagram illustrating a resonance frequency according to the remaining amount of the precursor.

A resonance frequency $f_n$ of a specific structure may be calculated through a corresponding mass m and a stiffness coefficient k of the structure as illustrated in the following equation.

$$f_n(\text{Hz}) = \frac{1}{2\pi} \cdot \sqrt{\frac{k}{m}}$$

[Equation 1]

6

The piezoelectric transducer 120 may measure a resonance frequency of a target through a process of emitting and receiving sound waves. Therefore, when the piezoelectric transducer 120 is applied to the canister 100 illustrated in FIG. 2, the piezoelectric transducer 120 may be able to measure the resonance frequency according to a change in mass of the solid precursor 130. In an embodiment, as the remaining amount of the precursor decreases, the frequency (resonance frequency) corresponding to the lowest point of the output voltage moves in a direction in which the frequency increases.

As illustrated in FIG. 3B, the mass of the precursor and the resonance frequency are proportional to each other. The remaining amount corresponding to a specific resonance frequency may be predicted through a relational expression between the resonance frequency and the remaining amount of the precursor.

In addition, the canister 100 according to an embodiment may release vapor trapped between the particles by vibrating the precursor particles using the piezoelectric transducer 120.

Figure 4A:
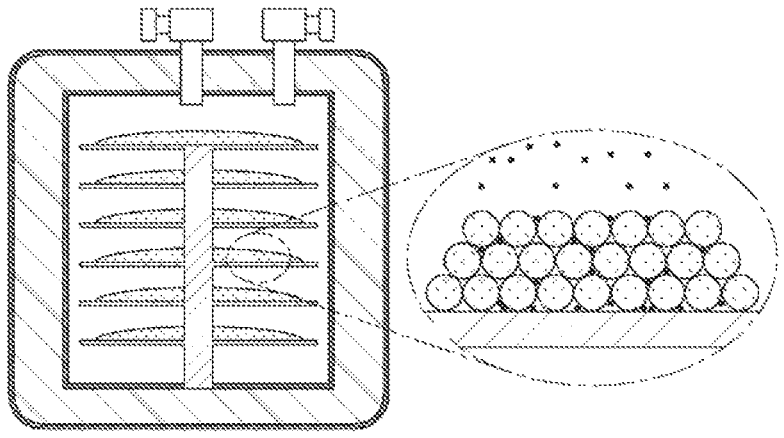
FIG. 4A is a diagram illustrating a phenomenon in which a sublimed precursor is trapped between powder particles in the case of a general canister.
Figure 4B:
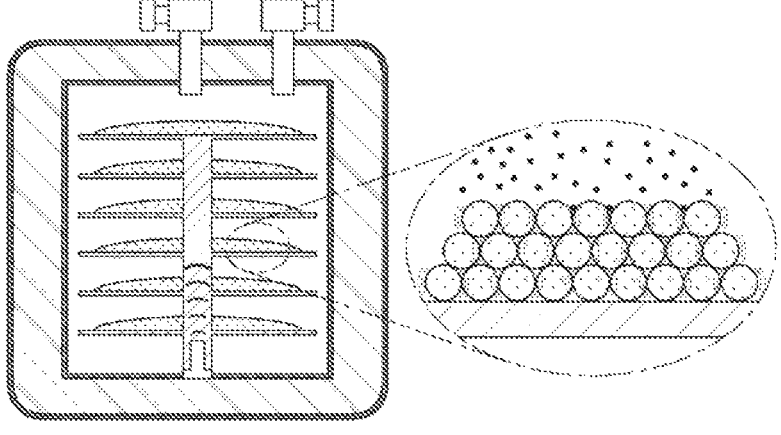
FIG. 4B is a view illustrating a phenomenon in which vapor trapped between powder particles is emitted through vibrations applied to the powder particles in the case of a solid precursor canister using a piezoelectric transducer.

FIG. 4A is a diagram illustrating a phenomenon in which a sublimed precursor is trapped between powder particles in the case of a general canister, and FIG. 4B is a view illustrating a phenomenon in which vapor trapped between powder particles is released through vibrations applied to the powder particles in the case of a solid precursor canister using a piezoelectric transducer. The canister 100 according to an embodiment may enable a more stable precursor supply by releasing vapor trapped in the powder by vibrating the piezoelectric transducer 120.

Figure 5A:
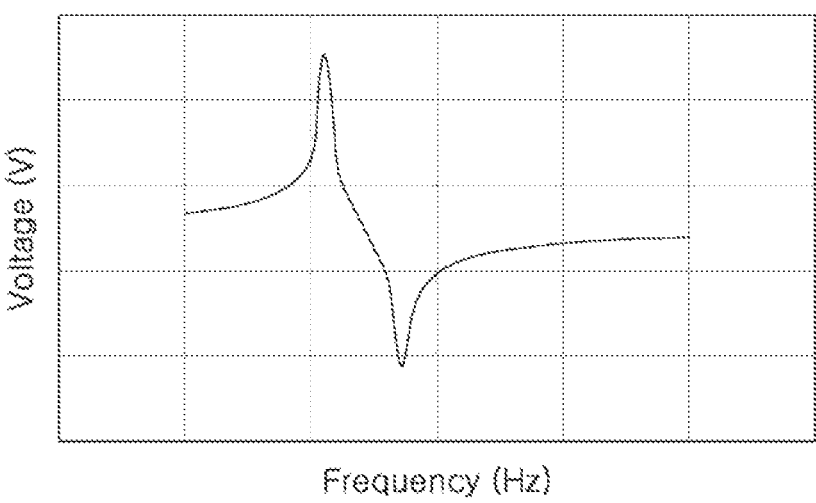
FIG. 5A is a diagram illustrating a resonance frequency of a precursor having a specific mass.
Figure 5B:
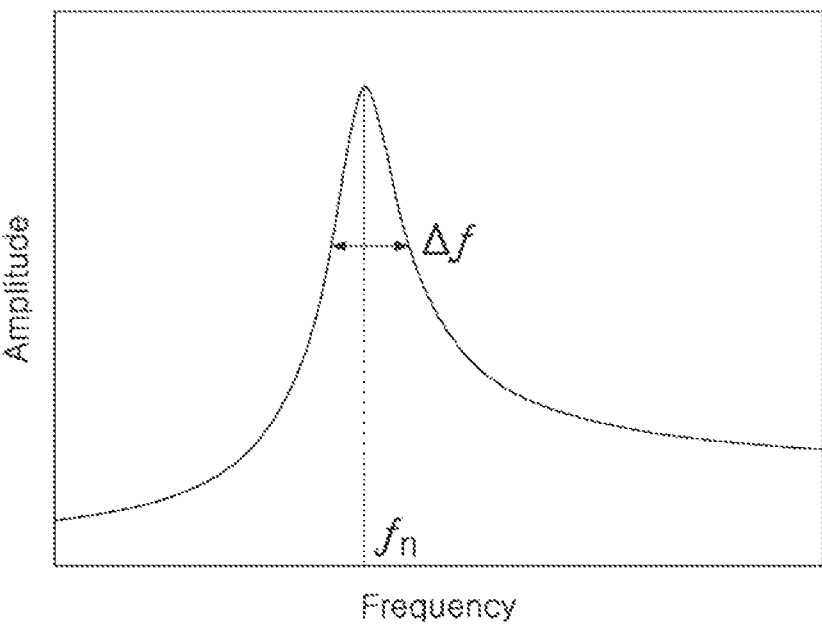
FIG. 5B is a diagram illustrating that a maximum amplitude occurs in a resonance frequency range.

FIG. 5A is a diagram illustrating a resonance frequency of a precursor having a specific mass, and FIG. 5B is a diagram illustrating that a maximum amplitude is generated in a resonance frequency range.

As illustrated in FIG. 5A, the resonance frequency of the precursor may be measured by measuring an output voltage of the piezoelectric transducer 120. Sound waves in the corresponding frequency range may be transferred to the solid precursor powder through the piezoelectric transducer 120 (refer to FIG. 4B). Trapped vapors may be released by the vibration between the powder particles, and the canister 100 may stably supply the precursor (refer to FIG. 4B).

As illustrated in FIG. 5B, since particle vibration is maximum in the resonance frequency range, particle vibration may be maximized by applying sound waves in the resonance frequency range. Meanwhile, it may be necessary to change the applied vibration frequency as the remaining amount changes (refer to FIG. 3A).

Meanwhile, when the piezoelectric transducer 120 is applied, additional devices necessary for the operation of the piezoelectric transducer 120, such as a signal conditioner and a power amplifier, may be used.

Figure 6:
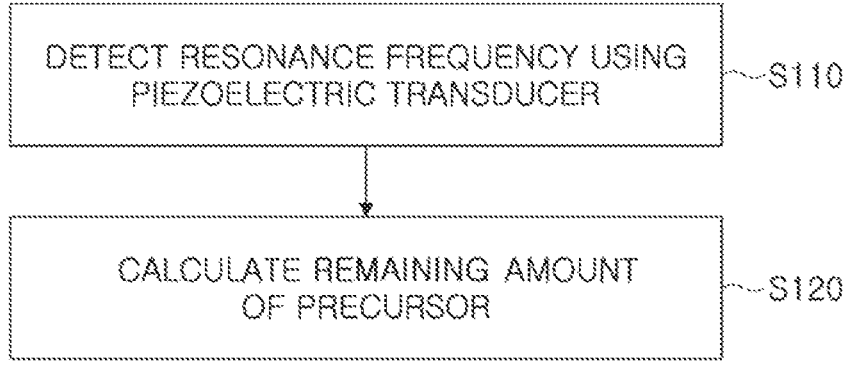
FIG. 6 is a diagram illustrating an operating method of a precursor transfer system according to an embodiment.

FIG. 6 is a diagram illustrating an operating method of the precursor transfer system 10 according to an embodiment. Referring to FIGS. 1 to 6, the operating method of the precursor transfer system 10 may be performed as follows.

The piezoelectric transducer 120 of the canister 100 may measure the resonance frequency of the canister 100 (S110). The controller 140 may calculate a remaining amount of the precursor using the resonance frequency measured by the piezoelectric transducer 120 (S120).

In an embodiment, a carrier gas may be introduced from a carrier gas supply device. In an embodiment, the canister 100 may heat the body to sublimate the solid precursor. In an embodiment, the calculated remaining amount of the solid precursor may be displayed.

Figure 7:
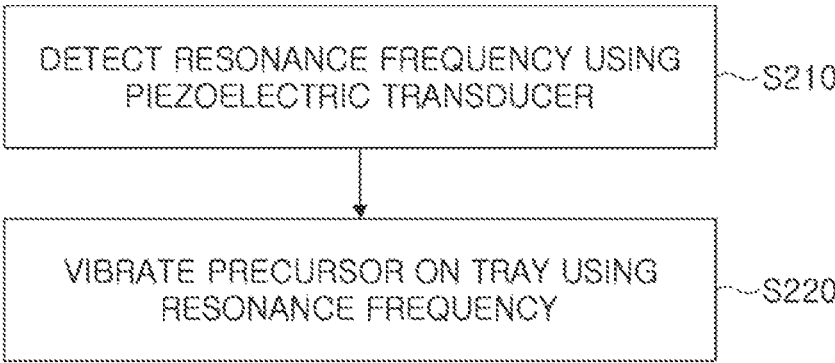
FIG. 7 is a diagram illustrating an operating method of a canister according to another embodiment.

FIG. 7 is a diagram illustrating an operating method of a canister according to another embodiment. Referring to FIGS. 1 to 7, the operating method of the precursor transferring system 10 may be performed as follows.

The piezoelectric transducer 120 of the canister 100 may measure a resonance frequency of the canister 100 (S210). The controller 140 may vibrate the canister 100 using the resonance frequency measured by the piezoelectric transducer 120 (S220).

Meanwhile, a canister according to an embodiment may be used in a deposition system.

Figure 8:
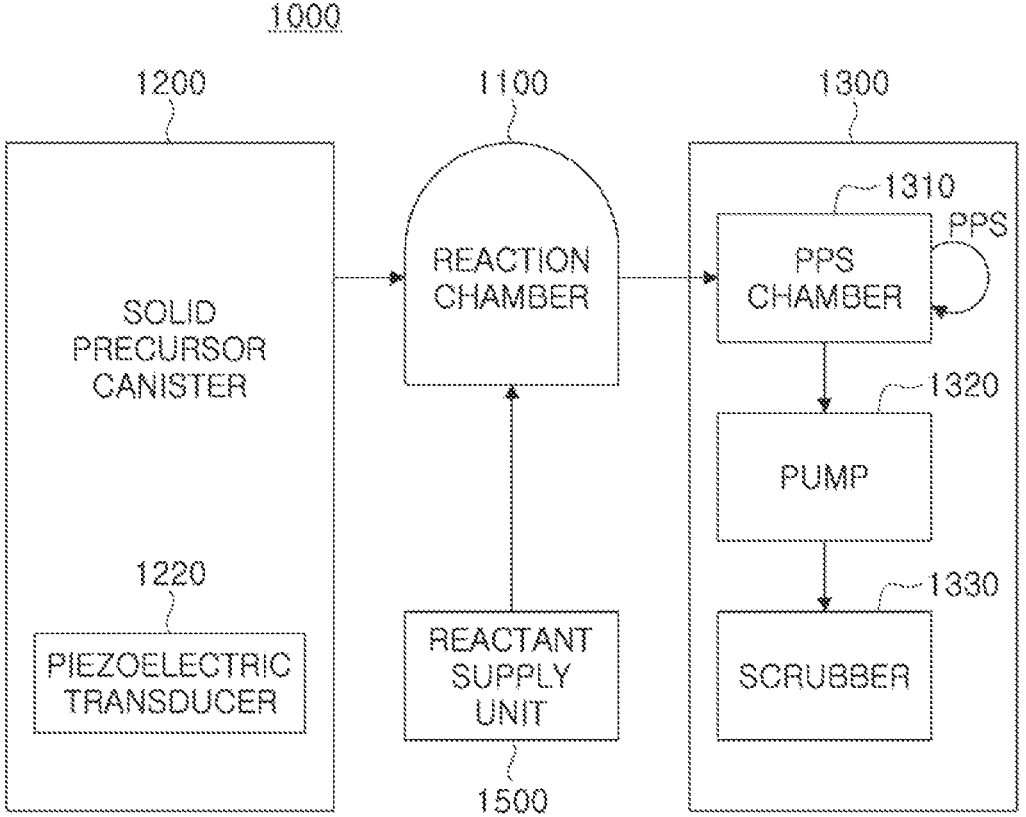
FIG. 8 is a diagram illustrating a deposition system according to an embodiment.

FIG. 8 is a diagram illustrating a deposition system 1000 according to an embodiment. Referring to FIG. 8, the deposition system 1000 may include a reaction chamber 1100, a gas supply device 1200, an exhaust device 1300, a main tank 1400, and a reactant supply unit 1500. The deposition system 1000 may be a system in which a chemical vapor deposition (CVD) or atomic layer deposition (ALD) process is performed. Commonly, the CVD process and the ALD process may be performed as a process of depositing a thin film on a substrate by supplying a precursor and a reactant into the reaction chamber 1100 to react with each other.

The precursor may exist in a liquid state or a solid state at room temperature, and may be vaporized by a component included in the gas supply device 1200 and supplied to the reaction chamber 1100 in a gaseous state. However, this is only an example, and embodiments are not limited thereto and the precursor may exist in a gaseous state at room temperature. In the deposition system 1000 according to an embodiment, the precursor may be a liquid reactant. For example, the precursor may be a metal organic precursor and may include group III, IV, and V elements. However, this is only an example, and embodiments are not limited thereto and the precursor may include other elements according to embodiments.

In a general deposition process, a vaporizer may be used as a vaporization device for phase-changing a precursor into a gaseous state. For example, the precursor may be phase-changed into a gaseous state using a baking method, and the gaseous precursor may be supplied to the reaction chamber 1100 using a carrier gas. The precursor supplied to the reaction chamber 1100 may be stored in a canister. In this case, when the amount of the precursor inside the canister is less than a predetermined amount as the process progresses, the canister may need to be replaced in order to proceed with the process again. Meanwhile, replacing the canister may require shutting down process equipment. For example, during a process equipment shutdown period, a cleaning process for removing impurities inside a pipe may be performed along with replacement of the canister.

Also, the gas supply device 1200 may include a piezoelectric transducer 1220 configured to vibrate the canister and/or measure a resonance frequency, as described above with reference to FIGS. 1 to 7.

Meanwhile, exhausts may be discharged to an exhaust end of the reaction chamber 1100, while the deposition process is in progress or after the deposition process is completed. For example, the exhausts may include gaseous reactants that have not been reacted during the deposition process or by-products after reacting. The exhausts may be easily phase-changed to a solid form, accumulate in a pump 1320 connected to the exhaust end of the reaction chamber 1100, and cause strain. As a result, it may be necessary to shut down the process equipment to replace a depleted pump.

In the deposition system 1000, the reaction chamber 1100 may include a deposition chamber in which a deposition process is performed. As an example, the deposition process may be a CVD or ALD process. However, this is only an example, and embodiments are not limited thereto and the reaction chamber 1100 of the deposition system 1000 according to an embodiment may include a chamber in which another process using gas spray is performed. For example, the reaction chamber 1100 may include a polishing process chamber performing cleaning by spraying a cleaning gas after a CMP process, an etching process chamber removing at least a partial region of a wafer or device layers formed on the wafer using plasma including radicals and ions of a source gas, and the like. Meanwhile, when a process other than the deposition process is performed, the gas supplied to the reaction chamber 1100 may not be limited to the precursor.

In the deposition system 1000 according to an embodiment, the gas supply device 1200 may include a sub-tank, a controller, and a vaporizer. A plurality of valves for adjusting the supply of the precursor may be disposed between or inside each component of the gas supply device 1200. However, this is only an example, and embodiments are not limited thereto and the number and location of the valves may be variably determined as needed. The sub-tank may include the canister described above with reference to FIGS. 1 to 7. The controller may measure a remaining amount of the solid precursor stored in the sub-tank or control vibration of the solid precursor. The vaporizer may phase-change the precursor to a gaseous state to supply the precursor to the reaction chamber 1100. The gaseous precursor may be supplied to the reaction chamber 1100 through a filter.

The reactant supply unit 1500 included in the deposition system 1000 may supply a reactant for forming a thin film by reacting with the precursor to the reaction chamber 1100. For example, the supplied reactant may include at least some of $H_2O$, $H_2O_2$, $O_3$, $NH_3$, and the like. However, this is only an example, and embodiments are not limited thereto and supplied reactants may be different according to embodiments.

In the deposition system 1000 according to an embodiment, exhausts may be discharged to the exhaust end of the reaction chamber 1100 while the deposition process is in progress or after the deposition process is completed. The discharged exhausts may be discharged from the deposition system 1000 through the exhaust device 1300. Meanwhile, the exhaust device 1300 may include a processing chamber (or a pre-plasma treatment system (PPS) chamber) 1310, a pump 1320, and a scrubber 1330.

Exhausts during the deposition process may be discharged through the pump 1320 and the scrubber 1330 after passing through a PPS system in the processing chamber 1310. However, the arrangement of the processing chamber 1310 is not limited to the form illustrated in FIG. 8, and, for example, the processing chamber 1310 may be disposed between the pump 1320 and the scrubber 1330 and there may be more than one processing chamber 1320. For example, in an embodiment, a plurality of processing chambers 1310 may be installed so that the PPS may be repeatedly applied several times.

The PPS applied to the exhausts in the processing chamber 1310 supplies a reaction gas to the exhausts. In an example, the reaction gas may be $O_2$. However, this is only an example, and embodiments are not limited thereto and other reaction gases may also be supplied according to embodiments. Metallic by-products included in the exhausts may react with the reaction gas to generate reactants, such as zirconia ($ZrO_2$). For example, zirconia may be in a powder form. However, reactants, such as zirconia, may

9 | 10 accumulate on an inner wall of the pipe and may cause a problem of obstructing the discharge of the exhausts.

In the deposition system 1000, the PPS may induce plasma discharge inside the processing chamber 1310. Meanwhile, by the plasma discharge, the exhausts in the deposition process may have improved decomposition performance and/or may be substituted with a material having good flowability and safety. Accordingly, the PPS may extend the life of the pump 1320 and improve the efficiency of the scrubber 1330.

For example, when PPS is applied, the life of the pump may be increased by 2 to 3 times compared to other cases. For example, when the PPS is not applied, a replacement cycle of the pump may be 1 month, and when the PPS is applied, the replacement cycle of the pump may be 2 to 3 months. However, this is only an example, and embodiments are not limited thereto and the replacement cycle of the pump may vary depending on a process environment, the performance of the PPS, the performance of the pump, and the like. In addition, the life of the pump increased by the application of the PPS may be twice as much as or more than the life of the pump to which the PPS is not applied or three times as much as or more than the life of the pump to which the PPS is not applied.

In the deposition system 1000, the exhausts discharged to the exhaust end of the reaction chamber 1100 may include materials in various states. The pump 1320 may serve to discharge the exhausts by using a negative pressure. The scrubber 1330 may serve to dissolve and absorb exhaust gas in a gaseous state among the exhausts. However, this is only an example, and embodiments are not limited thereto and the exhaust device 1300 may employ combinations of various methods for safely treating and discharging exhausts, and may further include additional components as necessary.

Embodiments may measure a remaining amount of the precursor in the solid precursor canister and improve the stability of supplying the precursor. For example, the canister according to an embodiment may measure the remaining amount of the precursor using a piezoelectric transducer. In addition, the canister of embodiments may improve a sublimation rate and supply stability by vibrating the precursor particles on the tray. The canister of embodiments may monitor the remaining amount. In addition, the canister of embodiments may control the sublimation rate through vibration of the solid precursor.

According to the canister, the precursor transfer system having the same, and the operating method thereof according to an embodiment, a remaining amount of a solid precursor may be monitored by detecting a resonance frequency or vibration using a piezoelectric transducer, and vapor trapped between the solid precursors may be released.

While aspects of example embodiments have been particularly shown and described, it will be understood that various changes in form and details may be made therein without departing from the spirit and scope of the following claims.

What is claimed is:

1. A method of forming a precursor transfer system, the method comprising:
   providing a processing chamber; and
   forming a canister configured to supply a sublimated gas of a solid precursor to the processing chamber,
   wherein the precursor transfer system comprises:
      a carrier gas supply device configured to discharge a carrier gas;
      the canister configured to receive the carrier gas through a first pipe and to discharge a mixed gas comprising the sublimated gas of the solid precursor through a second pipe;
      a reaction gas supply device configured to discharge at least one reaction gas through a third pipe; and
      the processing chamber configured to provide the mixed gas and the at least one reaction gas to a substrate on a chuck,
   wherein the canister comprises:
      a body;
      a first valve configured to introduce the carrier gas into the body;
      a second valve configured to discharge the sublimated gas of the solid precursor into the processing chamber;
      a precursor accommodating tray configured to accommodate the solid precursor; and
      at least one piezoelectric transducer configured to at least one of vibrate the precursor accommodating tray or measure a resonance frequency of the canister.

2. The method of claim 1, wherein the canister further comprises a controller configured to control the at least one piezoelectric transducer.

3. The method of claim 2, wherein the controller is configured to calculate a change in mass of the solid precursor using the resonance frequency measured by the at least one piezoelectric transducer.

4. The method of claim 2, wherein the controller is configured to release vapor trapped between particles of the solid precursor at least in part by controlling the at least one piezoelectric transducer.

5. The method of claim 2, wherein the at least one piezoelectric transducer is configured to vibrate the precursor accommodating tray at the measured resonance frequency.

6. The method of claim 1, wherein the solid precursor comprises at least one of $MoO_2Cl_2$ or $MoCl_5$.

7. The method of claim 1, wherein the body comprises a heating unit.

8. The method of claim 7, wherein the heating unit is on an outer circumferential surface of the body.

9. The method of claim 1, wherein the at least one piezoelectric transducer is inside the precursor accommodating tray.

10. The method of claim 1, wherein the canister further comprises a monitor configured to calculate a remaining amount of the solid precursor based at least in part on the resonance frequency and to monitor the remaining amount of the solid precursor.

11. A method of forming a precursor transfer system, the method comprising:
   providing a processing chamber; and
   forming a canister configured to supply a sublimated gas of a solid precursor to the processing chamber,
   wherein the precursor transfer system comprises:
      a carrier gas supply device configured to discharge a carrier gas;
      the canister configured to receive the carrier gas through a first pipe and to discharge a mixed gas comprising the sublimated gas of the solid precursor through a second pipe;
      a reaction gas supply device configured to discharge at least one reaction gas through a third pipe; and the processing chamber configured to provide the mixed gas and the at least one reaction gas to a substrate on a chuck, and wherein the canister comprises a piezoelectric transducer configured to vibrate a precursor accommodating tray to accommodate the solid precursor or measure a resonance frequency of the canister.

12. The method of claim 11, wherein the precursor transfer system further comprises:

a controller configured to control the piezoelectric transducer.

13. The method of claim 12, wherein the controller is configured to measure the resonance frequency at least in part by controlling the piezoelectric transducer, and wherein the controller is configured to calculate a remaining amount of the solid precursor in the canister using the measured resonance frequency.

14. The method of claim 12, wherein the controller is configured to vibrate the canister using the resonance frequency as a vibration frequency at least in part by controlling the piezoelectric transducer.

15. The method of claim 11, wherein the canister comprises the precursor accommodating tray configured to accommodate the solid precursor, and the precursor accommodating tray is configured to stack a plurality of support vessels.

16. A method of operating a precursor transfer system configured to accommodate a solid precursor, the method comprising:

detecting a resonance frequency of a canister using a piezoelectric transducer; and calculating a remaining amount of the solid precursor based at least in part on the detected resonance frequency, wherein the piezoelectric transducer is configured to vibrate a precursor accommodating tray or measure the resonance frequency of the canister.

17. The method of claim 16, further comprising vibrating the canister at the measured resonance frequency.

18. The method of claim 16, further comprising introducing a carrier gas from a carrier gas supply device.

19. The method of claim 16, further comprising heating the solid precursor to sublimate the solid precursor.

20. The method of claim 16, further comprising displaying the remaining amount of the solid precursor calculated in the calculating.

* * * * *